United States Patent
Katagiri

(10) Patent No.: US 10,957,513 B2
(45) Date of Patent: Mar. 23, 2021

(54) ELECTRON MICROSCOPE AND IMAGE PROCESSING METHOD

(71) Applicant: JEOL Ltd., Tokyo (JP)

(72) Inventor: Shinichi Katagiri, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/668,225

(22) Filed: Oct. 30, 2019

(65) Prior Publication Data

US 2020/0144021 A1 May 7, 2020

(30) Foreign Application Priority Data

Nov. 5, 2018 (JP) .............................. JP2018-207905

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01); *H01J 2237/221* (2013.01); *H01J 2237/2445* (2013.01)

(58) Field of Classification Search
CPC .. H01J 37/00; H01J 37/02; H01J 37/22; H01J 37/222; H01J 37/244; H01J 37/26; H01J 37/261

(Continued)

(56) References Cited

U.S. PATENT DOCUMENTS

2004/0188611 A1 9/2004 Takeuchi et al.
2005/0133718 A1 6/2005 Miyamoto et al.
(Continued)

FOREIGN PATENT DOCUMENTS

EP 2282197 A2 2/2011
JP 2004214060 A 7/2004
(Continued)

OTHER PUBLICATIONS

Rogerio et al., "Correlative Fractography: Combining Scanning Electron Microscopy and Light Microscopes for Qualitative and Quantitative Analysis of Fracture Surfaces", Microscopy and Microanalysis, 2013, pp. 496-500, vol. 19.
(Continued)

*Primary Examiner* — Jason L McCormack
(74) *Attorney, Agent, or Firm* — The Webb Law Firm

(57) ABSTRACT

An electron microscope includes: an electron detector which detects electrons emitted from a specimen upon irradiation of the specimen with an electron beam; an X-ray detector which detects X-rays emitted from the specimen upon irradiation of the specimen with the electron beam; and a processor which generates a three-dimensional element map based on output signals from the electron detector and the X-ray detector. The processor performs processing for generating a electron microscopic image based on the output signal from the electron detector, processing for generating a three-dimensional image of the specimen based on the electron microscopic image, processing for generating a two-dimensional element map based on the output signal from the X-ray detector, and processing for generating the three-dimensional element map by projecting the two-dimensional element map on the three-dimensional image.

6 Claims, 8 Drawing Sheets

(58) Field of Classification Search
USPC .......................................... 250/306, 307, 311
See application file for complete search history.

(56) References Cited

U.S. PATENT DOCUMENTS

| | | |
|---|---|---|
| 2007/0114398 A1 | 5/2007 | Miyamoto et al. |
| 2008/0237456 A1 | 10/2008 | Miyamoto et al. |
| 2011/0031215 A1 | 2/2011 | Mantz et al. |
| 2012/0223227 A1 | 9/2012 | Chen et al. |
| 2016/0079031 A1 | 3/2016 | Aoyama |
| 2016/0181061 A1* | 6/2016 | Kim ..................... H01J 37/28 250/307 |
| 2019/0228948 A1* | 7/2019 | Mizuno ................ H01J 37/222 |

FOREIGN PATENT DOCUMENTS

| | | |
|---|---|---|
| JP | 201140384 A | 2/2011 |
| JP | 201369693 A | 4/2013 |

OTHER PUBLICATIONS

Kaczmarek et al., "The Method for the Reconstruction of Complex Images of Specimens Using Backscattered Electrons", Scanning, Institute of Microsystem Technology, Wroclaw University of Technology, 2002, pp. 65-69, vol. 24.
Extended European Search Report issued in EP19206881 dated Apr. 2, 2020.
Notification of Reasons for Refusal issued in JP 2018-207905 dated Dec. 8, 2020.

* cited by examiner

ELECTRON MICROSCOPE AND IMAGE PROCESSING METHOD

CROSS-REFERENCE TO RELATED APPLICATION

This application claims priority to Japanese Patent Application No. 2018-207905 filed Nov. 5, 2018, the disclosure of which is hereby incorporated by reference in its entirety.

BACKGROUND OF THE INVENTION

The present invention relates to an electron microscope and an image processing method.

Using a scanning electron microscope, a scanning electron microscopic image (hereinafter also referred to as an "SEM image") can be obtained. The SEM image is a two-dimensional image.

A method for obtaining a three-dimensional image of a specimen using a scanning electron microscope has been known. For example, JP-A-2013-69693 discloses a method for generating a three-dimensional image of a specimen using a plurality of SEM images taken while the specimen is tilted at different tilt angles.

A tomography method has been known as a method for obtaining a three-dimensional image of a specimen using a transmission electron microscope. According to the tomography method, a three-dimensional image is reconstructed from a plurality of tilted images taken using the transmission electron microscope while the specimen is continuously tilted.

However, information on elements cannot be obtained in such a three-dimensional image obtained using an electron microscope such as a scanning electron microscope and a transmission electron microscope. When, for example, a characteristic part such as a protrusion is observed in a three-dimensional image, it is desirable that information on elements at the part is visually obtained.

SUMMARY OF THE INVENTION

According to a first aspect of the invention, there is provided an electron microscope including:

an electron source which emits an electron beam;

an optical system which irradiates a specimen with the electron beam;

a first detector which detects electrons emitted from the specimen or transmitted through the specimen upon irradiation of the specimen with the electron beam;

a second detector which detects a signal emitted from the specimen upon irradiation of the specimen with the electron beam; and a processor which generates a three-dimensional element map representing three-dimensional element distribution of the specimen based on an output signal from the first detector and an output signal from the second detector, the processor performing:

processing for generating an electron microscopic image based on the output signal from the first detector;

processing for generating a three-dimensional image of the specimen based on the electron microscopic image;

processing for generating a two-dimensional element map representing two-dimensional element distribution of the specimen based on the output signal from the second detector; and processing for generating the three-dimensional element map by projecting the two-dimensional element map on the three-dimensional image.

According to a second aspect of the invention, there is provided an image processing method in an electron microscope that includes: a first detector which detects electrons emitted from a specimen or transmitted through the specimen upon irradiation of the specimen with an electron beam; and a second detector which detects a signal emitted from the specimen upon irradiation of the specimen with the electron beam, the image processing method including:

generating an electron microscopic image based on an output signal from the first detector;

generating a three-dimensional image of the specimen based on the electron microscopic image;

generating a two-dimensional element map representing two-dimensional element distribution of the specimen based on an output signal from the second detector; and generating a three-dimensional element map representing three-dimensional element distribution of the specimen by projecting the two-dimensional element map on the three-dimensional image.

DESCRIPTION OF THE INVENTION

Figure 1:
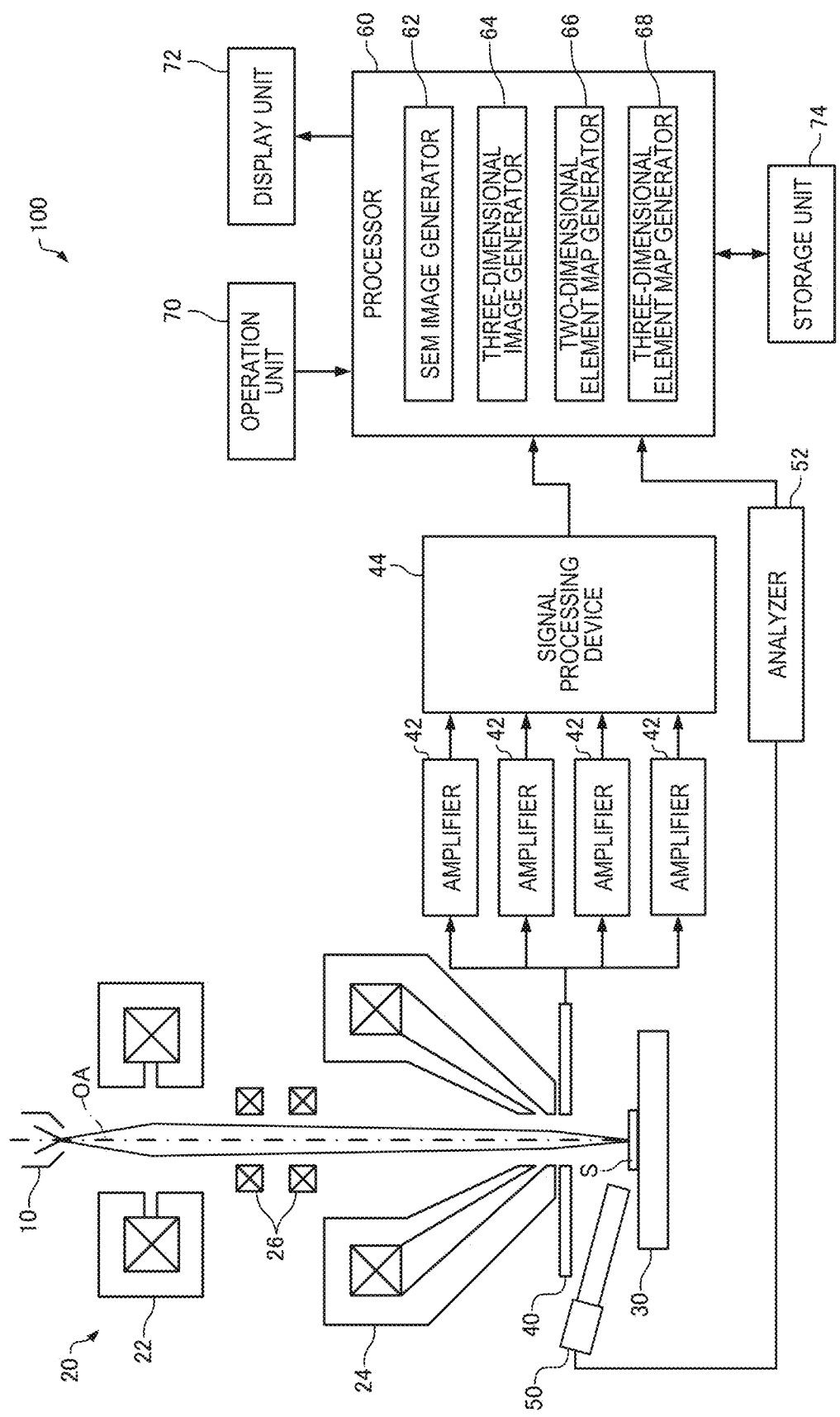
FIG. 1 is a diagram illustrating a structure of a scanning electron microscope according to the first embodiment.

According to an embodiment of the invention, there is provided an electron microscope including:

an electron source which emits an electron beam;

an optical system which irradiates a specimen with the electron beam;

a first detector which detects electrons emitted from the specimen or transmitted through the specimen upon irradiation of the specimen with the electron beam;

a second detector which detects a signal emitted from the specimen upon irradiation of the specimen with the electron beam; and a processor which generates a three-dimensional element map representing three-dimensional element distribution of the specimen based on an output signal from the first detector and an output signal from the second detector, the processor performing:

processing for generating an electron microscopic image based on the output signal from the first detector;

processing for generating a three-dimensional image of the specimen based on the electron microscopic image;

processing for generating a two-dimensional element map representing two-dimensional element distribution of the specimen based on the output signal from the second detector; and processing for generating the three-dimensional element map by projecting the two-dimensional element map on the three-dimensional image.

The electron microscope can generate a three-dimensional element map representing three-dimensional element distribution. Therefore, the electron microscope allows the three-dimensional distribution of elements to be easily recognized.

According to an embodiment of the invention, there is provided an image processing method in an electron microscope that includes: a first detector which detects electrons emitted from a specimen or transmitted through the specimen upon irradiation of the specimen with an electron beam; and a second detector which detects a signal emitted from the specimen upon irradiation of the specimen with the electron beam, the image processing method including:

generating an electron microscopic image based on an output signal from the first detector;

generating a three-dimensional image of the specimen based on the electron microscopic image;

generating a two-dimensional element map representing two-dimensional element distribution of the specimen based on an output signal from the second detector; and generating a three-dimensional element map representing three-dimensional element distribution of the specimen by projecting the two-dimensional element map on the three-dimensional image.

According to the image processing method, a three-dimensional element map representing three-dimensional element distribution can be generated.

Embodiments of the invention are described in detail below with reference to the drawings. Note that the following embodiments do not unduly limit the scope of the invention as stated in the claims. In addition, all of the elements described below are not necessarily essential requirements of the invention.

A scanning electron microscope will be described below as an example of the electron microscope according to the invention, while the electron microscope according to the invention may be a transmission electron microscope.

1. First Embodiment 1.1. Structure of Scanning Electron Microscope

A scanning electron microscope according to a first embodiment of the invention will be described in conjunction with the accompanying drawings. FIG. 1 is a diagram of a scanning electron microscope 100 according to the first embodiment.

As illustrated in FIG. 1, the scanning electron microscope 100 includes an electron source 10, an optical system 20, a specimen stage 30, an electron detector 40 (an example of the first detector), an X-ray detector 50 (an example of the second detector), a processor 60, an operation unit 70, a display unit 72, and a storage unit 74.

The electron source 10 emits an electron beam. The electron source 10 may be an electron gun which emits an electron beam by accelerating electrons emitted from the cathode at the anode.

The optical system 20 scans a specimen S with an electron beam emitted from the electron source 10. The optical system 20 includes a condenser lens 22, an objective lens 24, and a deflector 26.

The condenser lens 22 converges the electron beam emitted from the electron source 10. The condenser lens 22 allows the size of the electron beam and the current amount of the electron beam to be controlled.

The objective lens 24 converges the electron beam to form an electron probe. The objective lens 24 for example includes a coil and a yoke. Using the objective lens 24, a magnetic line of force generated by the coil is confined at the yoke made of a material with a high magnetic permeability such as iron, and a notch (a lens gap) is provided at a part of the yoke, so that a highly densely distributed magnetic line of force can be leaked on the optical axis OA.

The deflector 26 deflects an electron beam two-dimensionally. A scanning signal generated by a scanning signal generator (not shown) is supplied to the deflector 26, so that the specimen S can be scanned with an electron beam.

The specimen stage 30 holds the specimen S. The specimen stage 30 includes a horizontal movement mechanism that moves the specimen S in the horizontal direction, a height direction movement mechanism that moves the specimen S in the height direction, and a tilt mechanism that tilts the specimen S. The specimen S can be positioned by the specimen stage 30.

The electron detector 40 is a detector which detects secondary electrons or reflected electrons emitted from the specimen S. The electron detector 40 outputs a signal corresponding to the amount of detected electrons. The electron detector 40 is provided between the objective lens 24 and the specimen S. In the illustrated example, the electron detector 40 is provided immediately below the objective lens 24.

Figure 2:
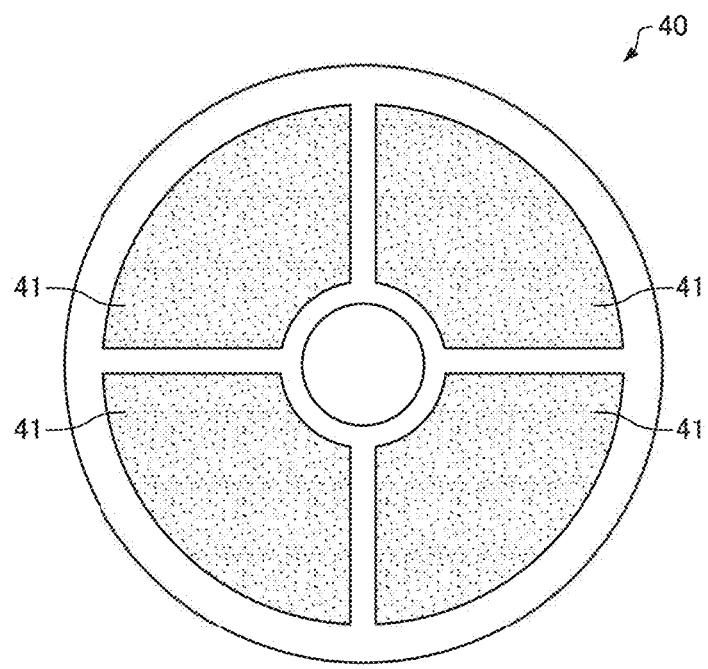
FIG. 2 is a schematic plan view of an electron detector.

FIG. 2 is a schematic plan view of the electron detector 40. As illustrated in FIG. 2, the electron detector 40 is a split type detector having its detection surface divided into a plurality of detection regions 41. The electron detector 40 is arranged so that the optical axis OA passes through the center of the annular detection surface.

In the illustrated example, the number of detection region 41 is four. The four detection regions 41 can detect electrons independently from one another. The four detection regions 41 each outputs a detection signal corresponding to the amount of detected electrons. For example, the four detection regions 41 output a first detection signal, a second detection signal, a third detection signal, and a fourth detection signal, respectively. In other words, the electron detector 40 outputs the first detection signal, the second detection signal, the third detection signal, and the fourth detection signal as output signals.

Note that the shape of the detection surface and the number of divisions of the electron detector 40 are not limited to those of the example illustrated in FIG. 2. A plurality of electron detectors each having one detection region may be arranged as the electron detector 40 instead of the split type detector.

In the example illustrated in FIG. 1, the electron detector 40 is provided immediately below the objective lens 24, while the position of the electron detector 40 is not particularly limited if the detector can detect electrons emitted from the specimen S.

As illustrated in FIG. 1, the scanning electron microscope 100 has four amplifiers 42 corresponding to the four detection regions 41. The first, second, third, and fourth detection signals are amplified by the corresponding amplifiers 42.

A signal processing device 44 performs processing for converting the first, second, third, and fourth detection signals into signals that can be read by the processor 60. The signal processing device 44 may also perform processing for associating the first to fourth detection signals with information on the irradiation position of the electron beam.

The X-ray detector 50 detects X-rays emitted from the specimen S when the specimen S is irradiated with the electron beam. The X-ray detector 50 may be an energy-dispersive X-ray spectrometer (EDS). Note that the X-ray detector 50 may be a wavelength-dispersive X-ray detector. The output signal from the X-ray detector 50 is sent to an analyzer 52.

The analyzer 52 analyzes the X-ray energy value based on the output signal from the X-ray detector 50 and generates an X-ray energy signal. The analyzer 52 includes, for example, a multi-pulse height analyzer having a plurality of channels, analyzes the energy value based on the pulse peak value of the output signal from the X-ray detector 50, and generates an X-ray energy signal. The X-ray energy signal includes energy information on the X-rays detected by the X-ray detector 50. The X-ray energy signal is sent to the processor 60.

The operation unit 70 obtains an operation signal in response to an operation by the user and sends the operation signal to the processor 60. The operation unit 70 may be a button, a key, a touch panel display, or a microphone.

The display unit 72 displays an image generated by the processor 60. The display unit 72 can be implemented by a display such as a liquid crystal display (LCD).

The storage unit 74 stores programs, data, and the like for the processor 60 to perform various kinds of calculation and control processing. The storage unit 74 is used as a work area for the processor 60 and is also used for temporarily storing calculation results and the like obtained by execution of various programs by the processor 60. The storage unit 74 can be implemented for example by a random access memory (RAM), a read only memory (ROM), or a hard disk.

The processor 60 performs processing such as processing for generating an SEM image, processing for generating a three-dimensional image of the specimen S, and processing for generating a two-dimensional element map. The processor 60 also performs processing for generating a three-dimensional element map based on the output signal from the electron detector 40 and the output signal from the X-ray detector 50. The function of the processor 60 can be implemented by executing a program by any of various processors such as a central processing unit (CPU). The processor 60 includes an SEM image generator 62, a three-dimensional image generator 64, a two-dimensional element map generator 66, and a three-dimensional element map generator 68.

The SEM image generator 62 generates an SEM image based on the output signal from the electron detector 40. The SEM image generator 62 generates four SEM images corresponding to the four detection regions 41. For example, the SEM image generator 62 generates a first SEM image based on the first detection signal. The SEM image generator 62 generates a second SEM image based on the second detection signal. The SEM image generator 62 generates a third SEM image based on the third detection signal. The SEM image generator 62 generates a fourth SEM image based on the fourth detection signal.

The three-dimensional image generator 64 reconstructs a three-dimensional image of the specimen S based on the first to fourth SEM images. The first to fourth SEM images are two-dimensional images based on the detection signals from the different detection regions 41. Therefore, the first to fourth SEM images have different electron detection directions and can be images obtained by viewing the specimen S in different directions. Therefore, the three-dimensional image of the specimen S can be reconstructed using the first to fourth SEM images. The method for generating the three-dimensional image of the specimen S using the first to fourth SEM images is not particularly limited, and any known method may be used.

The two-dimensional element map generator 66 generates a two-dimensional element map based on the output signal from the X-ray detector 50. The two-dimensional element map is an element map representing two-dimensional element distribution. The two-dimensional element map generator 66 obtains information on the signal intensity (count rate) of X rays having energy specific to a desired element based on the X-ray energy signal from the analyzer 52 and generates a two-dimensional element map of the desired element.

The two-dimensional element map generator 66 generates a two-dimensional element map for one element. Therefore, when a plurality of elements are specified as analysis targets, the two-dimensional element map generator 66 generates a plurality of two-dimensional element maps. Note that the two-dimensional element map generator 66 may generate a single two-dimensional element map representing the distribution of a plurality of elements by superposing a plurality of two-dimensional element maps on one another.

The three-dimensional element map generator 68 projects the two-dimensional element map on the three-dimensional image generated by the three-dimensional image generator 64 to generate a three-dimensional element map. The three-dimensional element map is an element map representing three-dimensional element distribution. The three-dimensional element map generator 68 may project a two-dimensional element map on a three-dimensional image of the specimen S by a texture mapping method. The method for projecting the two-dimensional element map on the three-dimensional image is not particularly limited.

The processor 60 performs processing for displaying the generated three-dimensional element map on the display unit 72. The processor 60 may also perform processing for displaying the generated SEM images, the three-dimensional image, and the two-dimensional element map on the display unit 72.

1.2. Operation of Scanning Electron Microscope

In the scanning electron microscope 100, an electron beam emitted from the electron source 10 is converged by the condenser lens 22 and the objective lens 24 and deflected by the deflector 26, so that the specimen S is scanned with the electron beam. In this way, electrons such as secondary electrons and reflected electrons and characteristic X-rays are emitted from the specimen S.

The electrons emitted from the specimen S are detected by the electron detector 40. Since the electron detector 40 has the four detection regions 41, the SEM image generator 62 generates four SEM images based on output signals from the electron detector 40.

The three-dimensional image generator 64 generates a three-dimensional image of the specimen S based on the four SEM images.

Figure 3:
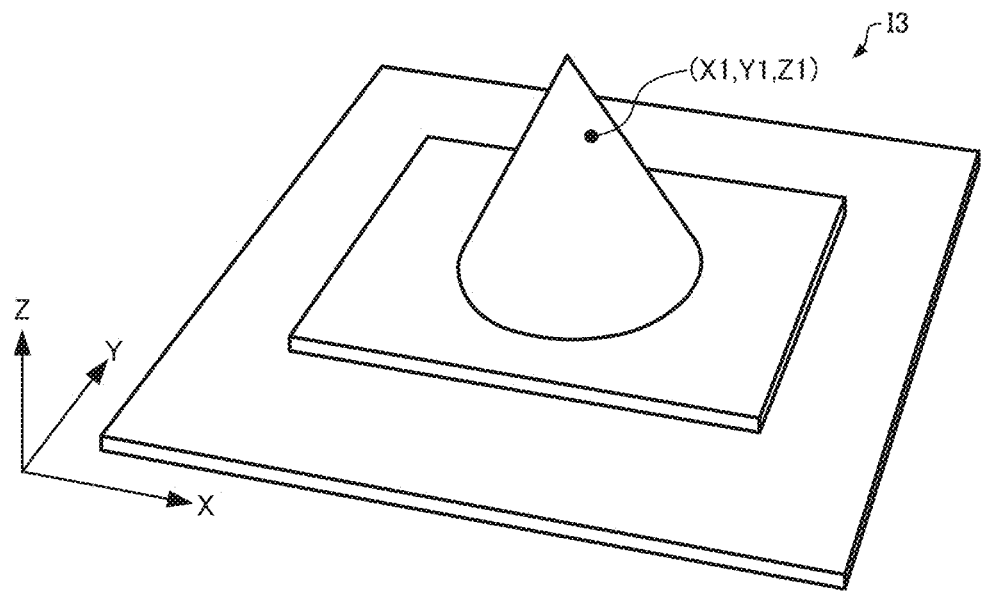
FIG. 3 schematically illustrates a three-dimensional image of a specimen.

FIG. 3 schematically illustrates a three-dimensional image I3 of the specimen S. In FIG. 3, X-, Y-, and Z-axes are illustrated as three axes orthogonal to one another. The Z-direction corresponds to the height direction of the specimen S.

As illustrated in FIG. 3, the three-dimensional image I3 can be generated from the four SEM images obtained using the electron detector 40.

X-rays emitted from the specimen S are detected by the X-ray detector 50. The two-dimensional element map generator 66 generates a plurality of two-dimensional element maps based on the output signal from the X-ray detector 50.

Figure 4:
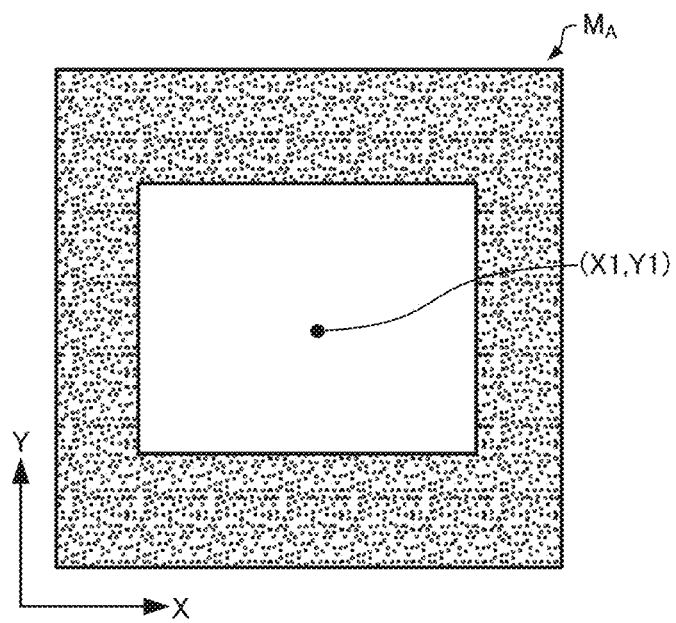
FIG. 4 schematically illustrates a two-dimensional element map of an element A.
Figure 5:
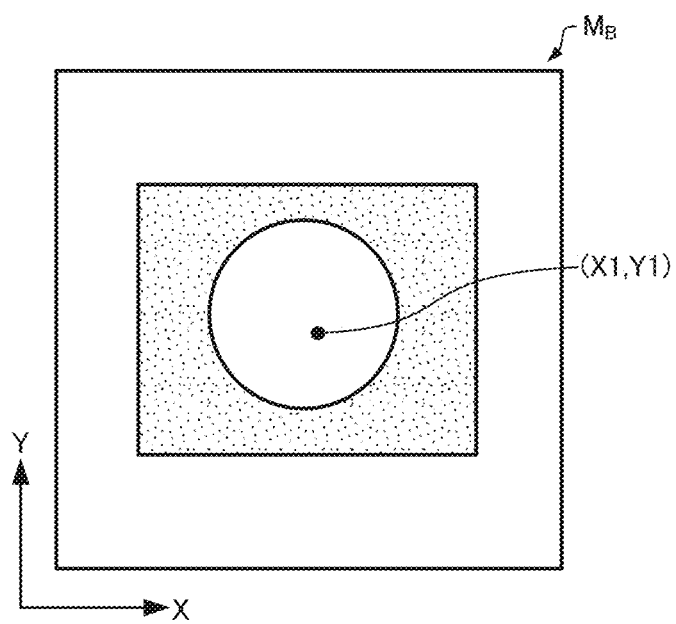
FIG. 5 schematically illustrates a two-dimensional element map of an element B.
Figure 6:
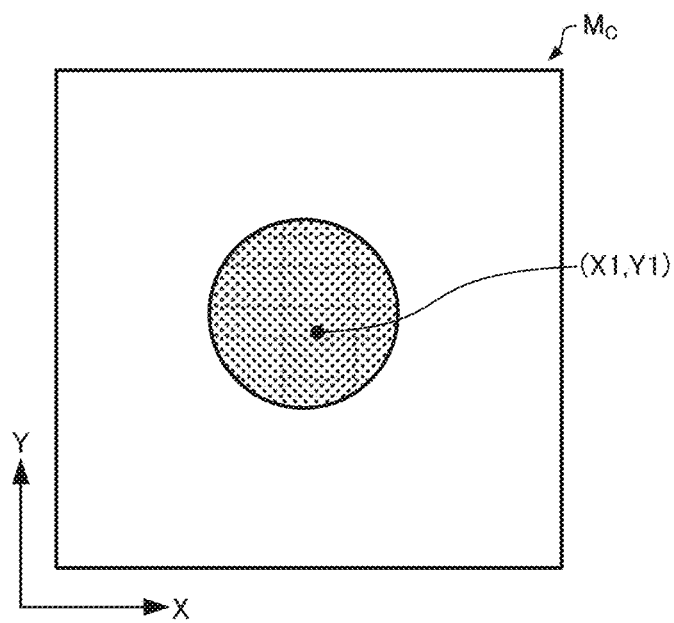
FIG. 6 schematically illustrates a two-dimensional element map of an element C.

FIG. 4 schematically illustrates a two-dimensional element map $M_A$ of an element A. FIG. 5 schematically illustrates a two-dimensional element map $M_B$ of an element B. FIG. 6 schematically illustrates a two-dimensional element map $M_C$ of an element C. FIGS. 4 to 6 illustrate the X- and Y-axes as two orthogonal axes. The X- and Y-axes illustrated in FIGS. 4 to 6 correspond to the X- and Y-axes illustrated in FIG. 3.

Here, the elements A, B, and C are specified as elements to be analyzed, and the two-dimensional element map generator 66 generates two-dimensional element maps $M_A$, $M_B$, and $M_C$ as illustrated in FIGS. 4 to 6.

The two-dimensional element map generator 66 generates the two-dimensional element maps $M_A$, $M_B$, and $M_C$ so that the kinds of elements are represented by hue and the signal intensities of the elements are represented by brightness. The signal intensity of an element may be a count rate (the number of X-rays incident on the X-ray detector 50 per second) when X-rays with energy specific to the element are detected. The count rate can be obtained by counting X-ray energy signals.

Figure 7:
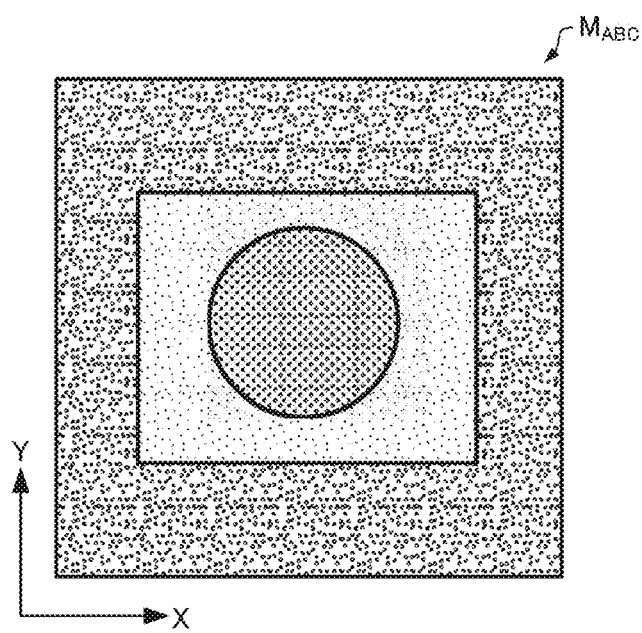
FIG. 7 schematically illustrates an element map produced by placing, upon each other, a two-dimensional element map of the element A, a two-dimensional element map of the element B, and a two-dimensional element map of the element C.

FIG. 7 schematically illustrates a two-dimensional element map $M_{ABC}$ generated by superposing the two-dimensional element maps $M_A$, $M_B$, and $M_C$ on one another.

As illustrated in FIG. 7, the two-dimensional element map generator 66 may superpose the two-dimensional element maps $M_A$, $M_B$, and $M_C$ upon one another to form one two-dimensional element map $M_{ABC}$. In the two-dimensional element maps $M_A$, $M_B$, and $M_C$, the kinds of elements are represented by hue, and the signal intensities of the elements are represented by brightness. Therefore, when a plurality of elements exist in the same pixel, the two-dimensional element map $M_{ABC}$ can indicate the existence of the plurality of elements in the same pixel.

The three-dimensional element map generator 68 projects the two-dimensional element maps $M_A$, $M_B$, and $M_C$ on the three-dimensional image I3 generated by the three-dimensional image generator 64 and generates a three-dimensional element map.

Figure 8:
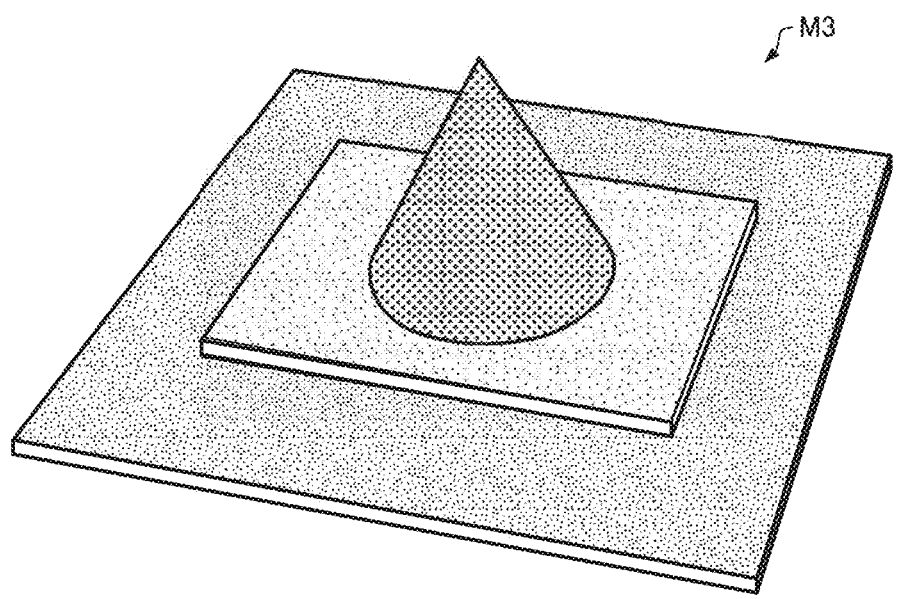
FIG. 8 schematically illustrates a three-dimensional element map.

FIG. 8 schematically illustrates a three-dimensional element map M3. As illustrated in FIG. 8, the three-dimensional element map M3 can be generated by projecting the two-dimensional element maps $M_A$, $M_B$, and $M_C$ on the three-dimensional image I3.

For example, a three-dimensional element map M3 can be generated by projecting the two-dimensional element maps $M_A$, $M_B$, and $M_C$ in the Z-direction on the three-dimensional image I3. More specifically, as illustrated in FIG. 3, in the three-dimensional image I3, when an arbitrary pixel on the surface of the specimen S has coordinates (X1, Y1, Z1), the color of the pixel is obtained by superposing, on one another, the color of the coordinates (X1, Y1) in the two-dimensional element map $M_A$ and the color of the coordinates (X1, Y1) in the two-dimensional element map $M_B$ and the color of the coordinates (X1, Y1) in the two-dimensional element map $M_C$. In this way, in the three-dimensional image I3, the processing for setting the color of each pixel on the surface of the specimen S to the color of the pixel in corresponding two-dimensional element maps is performed for all the pixels that form the surface of the specimen S. When there is no pixel corresponding to a two-dimensional element map in the three-dimensional image, the color of the pixel may be interpolated based on the colors of surrounding pixels. In this way, the two-dimensional element maps can be projected on the three-dimensional image.

Note that the three-dimensional element map M3 may be generated by projecting the two-dimensional element map $M_{ABC}$ illustrated in FIG. 7 on the three-dimensional image I3.

The scanning electron microscope 100 can also generate a three-dimensional element map M3 by real-time processing. In the real-time processing, interruption of the movement of the specimen stage 30 is detected, and a two-dimensional element map starts to be generated from the time point when the interruption of the movement of the specimen stage 30 is detected, and the generated two-dimensional element map is projected on the three-dimensional image, so that a three-dimensional element map is produced. In the real-time processing, data during the movement of the specimen stage 30 is discarded, data is collected from the time point when the movement of the specimen stage 30 is interrupted, and a three-dimensional element map is automatically generated.

1.3. Processing

Figure 9:
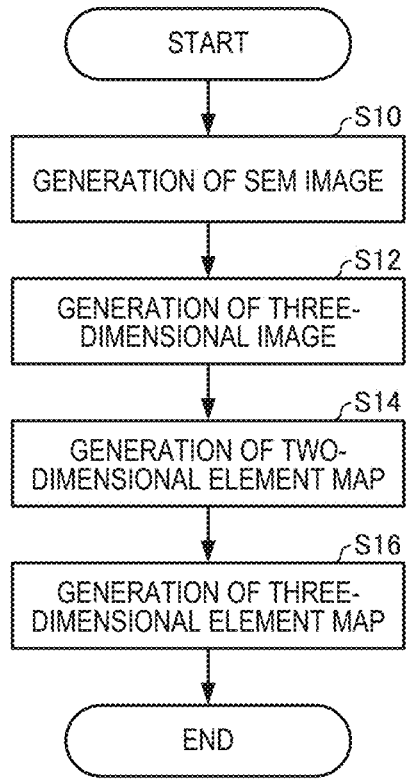
FIG. 9 is a flowchart for illustrating an example of processing by a processor.

Now, processing by the processor 60 will be described. FIG. 9 is a flowchart for illustrating an example of the processing by the processor 60.

In the scanning electron microscope 100, electrons such as secondary electrons and reflected electrons and characteristic X-rays are emitted from the specimen S when the specimen S is scanned with an electron beam using the optical system 20. The electrons emitted from the specimen S are detected by the electron detector 40, and the characteristic X-rays emitted from the specimen S are detected by the X-ray detector 50.

The SEM image generator 62 generates an SEM image based on an output signal from the electron detector 40 (S10). Since the electron detector 40 has the four detection regions 41, four SEM images are generated.

The three-dimensional image generator 64 generates a three-dimensional image of the specimen S based on the four SEM images generated by the SEM image generator 62 (S12).

The two-dimensional element map generator 66 generates a plurality of two-dimensional element maps based on an output signal from the X-ray detector 50 (S14).

The three-dimensional element map generator 68 projects the plurality of two-dimensional element maps on the three-dimensional image of the specimen S generated by the three-dimensional image generator 64 to generate a three-dimensional element map (S16). The generated three-dimensional element map is displayed for example on the display unit 72.

Through the above processing, the three-dimensional element map can be generated.

Note that the order of processing is not particularly limited. For example, after generating a two-dimensional element map, an SEM image may be generated to generate a three-dimensional image, or processing for generating a two-dimensional element map and processing for generating an SEM image may be performed in parallel.

1.4. Features

For example, the scanning electron microscope 100 has the following features.

In the scanning electron microscope 100, the processor 60 performs processing for generating an SEM image based on an output signal from the electron detector 40, processing for generating a three-dimensional image of the specimen S based on the SEM image, processing for generating a two-dimensional element map based on an output signal from the X-ray detector 50, and processing for generating a three-dimensional element map by projecting the two-dimensional element map on the three-dimensional image.

Therefore, the scanning electron microscope 100 can generate a three-dimensional element map representing three-dimensional element distribution. Therefore, using the scanning electron microscope 100, the user can easily understand the three-dimensional distribution of elements by observing the generated three-dimensional element map. For example, in a three-dimensional element map, when a characteristic part such as a protrusion is observed, information on the element at the part can be visually recognized.

Using the scanning electron microscope 100, in the processing for generating a two-dimensional element map, a plurality of two-dimensional element maps are generated, and in the processing for generating a three-dimensional element map, a plurality of two-dimensional element maps are projected on a three-dimensional image. Therefore, the scanning electron microscope 100 can generate a three-dimensional element map which allows the three-dimensional distribution of a plurality of elements to be available.

Using the scanning electron microscope 100, in the processing for generating a two-dimensional element map, the hue of the pixels which form the two-dimensional element map is set to correspond to the kinds of elements, and the brightness of the pixels which form the two-dimensional element map is set to correspond to the signal intensities of the elements. Therefore, when a plurality of elements exist in the same pixel, the three-dimensional element map can indicate the existence of the plurality of elements in the pixel.

The image processing method according to the first embodiment includes the steps of generating an SEM image based on an output signal from the electron detector 40, generating a three-dimensional image of a specimen S based on the SEM image, generating a two-dimensional element map of the specimen S based on an output signal from the X-ray detector 50, and generating a three-dimensional element map by projecting the two-dimensional element map on the three-dimensional image. Therefore, according to the image processing method according to the first embodiment, a three-dimensional element map representing three-dimensional element distribution can be generated.

2. Second Embodiment 2.1. Scanning Electron Microscope

Figure 10:
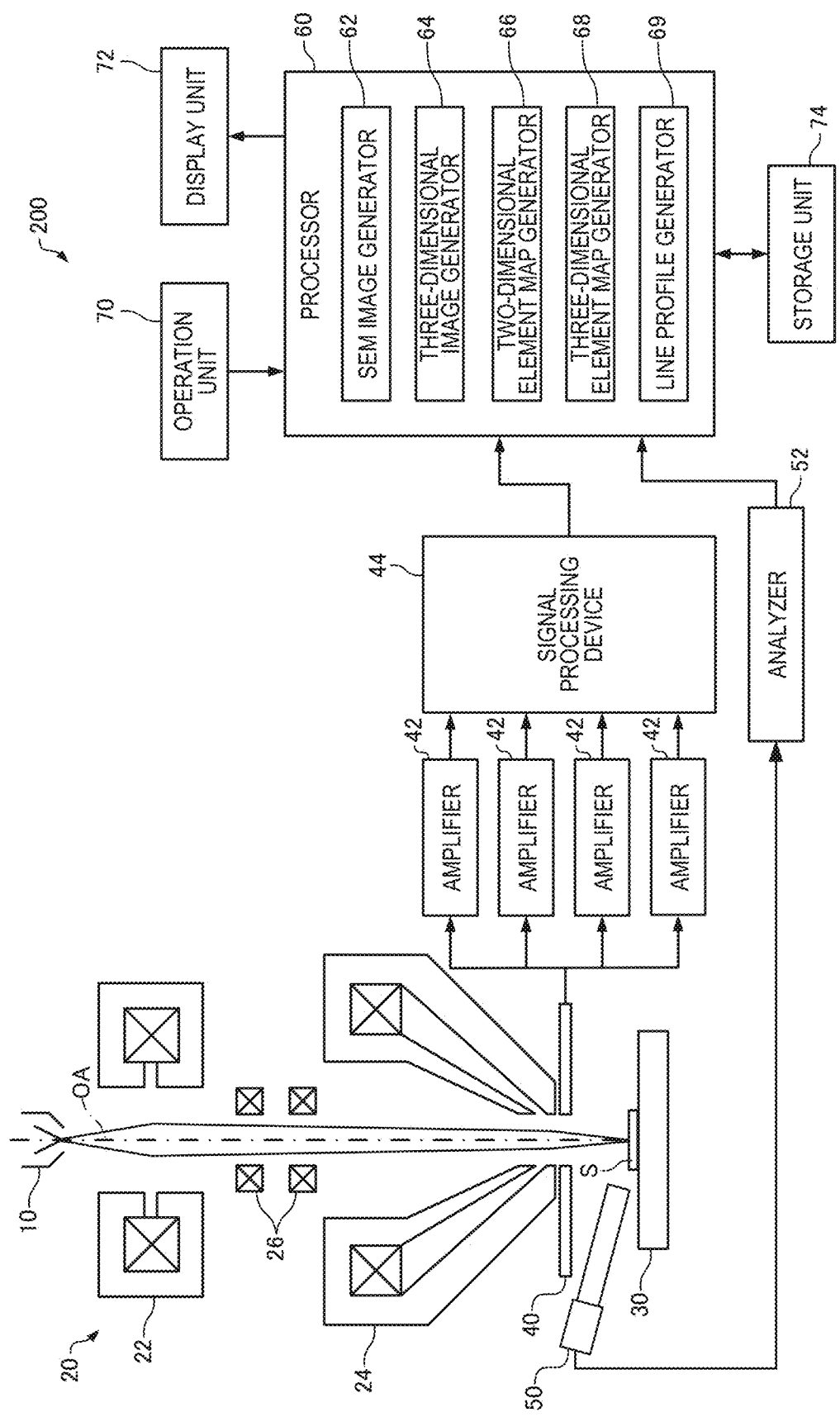
FIG. 10 is a diagram illustrating a structure of a scanning electron microscope according to the second embodiment.

Now, a scanning electron microscope according to a second embodiment will be described with reference to the drawings. FIG. 10 is a diagram illustrating the structure of a scanning electron microscope 200 according to the second embodiment. Hereinafter, in the scanning electron microscope 200 according to the second embodiment, members having the same functions as the members of the scanning electron microscope 100 according to the first embodiment are designated by the same reference characters, and detailed description thereof will not be provided.

As illustrated in FIG. 10, in the scanning electron microscope 200, the processor 60 includes a line profile generator 69. When an arbitrary section is specified in a three-dimensional element map, the line profile generator 69 generates a graph including a signal intensity profile of an element in the section and the height profile of the specimen S in the section.

Figure 11:
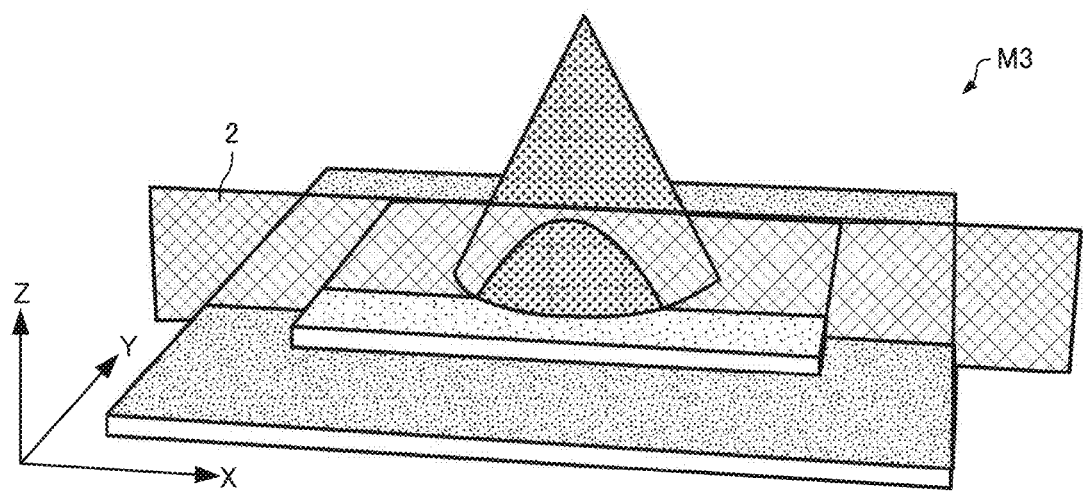
FIG. 11 schematically illustrates a three-dimensional element map in which an arbitrary section is specified.

FIG. 11 schematically illustrates a three-dimensional element map in which an arbitrary section is specified.

In the scanning electron microscope 200, an arbitrary section 2 can be specified on a three-dimensional element map M3. For example, the user can set the section 2 on the three-dimensional element map M3 displayed on the display unit 72 by operating the operation unit 70 on the three-dimensional element map M3.

In the illustrated example, the section 2 is a straight line parallel to the X-axis when viewed in the Z direction. The section 2 may be a polygonal line or a curved line when viewed in the Z direction.

When the section 2 is specified in the three-dimensional element map M3, the line profile generator 69 generates a graph including signal intensity profiles of elements in the specified section 2, a height profile of the specimen S in the specified section 2.

Figure 12:
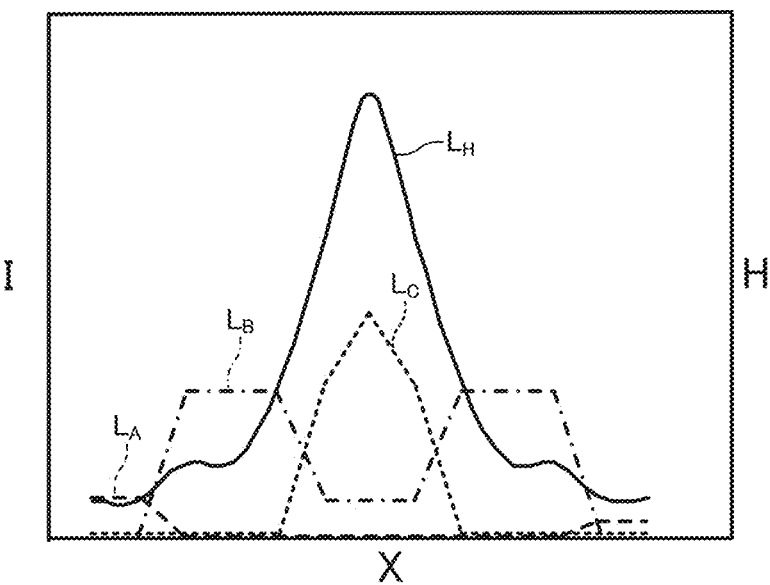
FIG. 12 is a graph illustrating a signal intensity profiles of elements and a height profile of a specimen in an arbitrary section.

FIG. 12 is a graph illustrating the signal intensity profiles of elements and the height profile of the specimen S in the section 2. The graph in FIG. 12 indicates the line profile $L_A$ of the element A, the line profile $L_B$ of the element B, the line profile $L_C$ of the element C, and the line profile $L_H$ of the height of the specimen S. Note that the horizontal axis of the graph in FIG. 12 represents the X coordinate. The graph in FIG. 12 has two vertical axes, the vertical axis for the line profiles $L_A$, $L_B$, and $L_C$ represents the signal intensity I, and the vertical axis for the line profile $L_H$ represents the height H.

For example, the line profile generator 69 generates the line profiles $L_A$, $L_B$, and $L_C$ and the line profile $L_H$ based on the three-dimensional element map M3. The line profile $L_A$ represents change in the signal intensity of the element A in the section 2. The line profile $L_B$ represents change in the signal intensity of the element B in the section 2. The line profile $L_C$ represents change in the signal intensity of the element C in the section 2. The line profile $L_H$ represents change in the height of the specimen S in the section 2.

It may be considered that the line profile $L_A$ represents change in the signal intensity of the element A in a straight line when the section 2 is viewed in the Z-axis direction. This also applies to the line profiles $L_B$, $L_C$, and $L_H$.

The line profile generator 69 may generate the line profiles $L_A$ based on the two-dimensional element map $M_A$ of the element A, the line profile $L_B$ based on the two-dimensional element map $M_B$ of the element B, and the line profile $L_C$ based on the two-dimensional element map $M_C$ of the element C. The line profile generator 69 may generate the line profile $L_H$ based on the three-dimensional image I3.

The graph generated by the line profile generator 69 is displayed for example on the display unit 72.

In the scanning electron microscope 200, when the arbitrary section 2 is specified in the three-dimensional element map M3, the processor 60 performs processing for generating a graph including the signal intensity profiles of the elements in the section 2 and the height profile of the specimen S in the section 2. Therefore, the scanning electron microscope 200 allows the relation between the height of the specimen S and the composition of the specimen S to be easily checked.

Note that the invention is not limited to the above-described embodiments, and various modifications can be made within the scope of the invention.

For example, as illustrated in FIG. 2, according to the first and second embodiments, a plurality of SEM images are obtained using the electron detector 40 having the plurality of detection regions 41 to generate the three-dimensional image of the specimen S, while the method for generating the three-dimensional image of the specimen S is not limited to this method.

Figure 13:
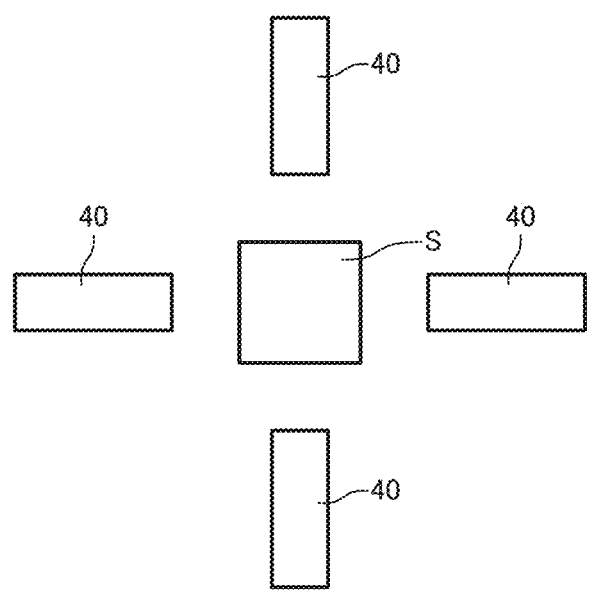
FIG. 13 a diagram illustrating arrangement of a plurality of electron detectors.

For example, as illustrated in FIG. 13, using a plurality of electron detectors 40 arranged so that the direction for detecting electrons emitted from the specimen S is different among the detectors, a plurality of SEM images are obtained, and a three-dimensional image of the specimen S may be generated based on the obtained SEM images. Alternatively, a plurality of SEM images may be acquired by changing the tilt angle of the specimen S, and a three-dimensional image of the specimen S may be generated based on the obtained SEM images.

In addition, the scanning electron microscope 100 according to the first embodiment includes the X-ray detector 50, and the element map is obtained using the X-ray detector 50, but the detector for obtaining an element map is not limited to the detector. For example, the scanning electron microscope 100 includes an Auger electron microscope (AES) and may obtain an element map using the Auger electron microscope. In this case, the scanning electron microscope 100 may obtain an element map by scanning the specimen surface with an electron beam irradiated upon measurement points and detecting Auger electrons emitted from the measurement points. This also works for the second embodiment described above.

According to the first and second embodiments described above, the electron microscope according to the invention is a scanning electron microscope, while the electron microscope according to the invention may be a transmission electron microscope.

A transmission electron microscope can generate a three-dimensional image using a tomography method. The tomography method is a method for reconstructing a three-dimensional image from a plurality of transmission electron microscopic images taken while continuously tilting a specimen in a transmission electron microscope. The transmission electron microscopic image can be obtained by detecting electrons transmitted through the specimen using a detector. In the transmission electron microscope, a two-dimensional element map can be generated based on an output signal from an X-ray detector similarly to the scanning electron microscope 100. A three-dimensional element map can be generated by projecting the two-dimensional element map on a three-dimensional image generated by the tomography method.

The above-described embodiments and modifications are examples and the invention is not limited thereto. For example, the embodiments and the modifications may be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. An electron microscope comprising:
an electron source which emits an electron beam;
an optical system which irradiates a specimen with the electron beam;
a first detector which detects electrons emitted from the specimen or transmitted through the specimen upon irradiation of the specimen with the electron beam;
a second detector which detects a signal emitted from the specimen upon irradiation of the specimen with the electron beam; and
a processor which generates a three-dimensional element map representing three-dimensional element distribution of the specimen based on an output signal from the first detector and an output signal from the second detector,
the processor performing:
processing for generating an electron microscopic image based on the output signal from the first detector;
processing for generating a three-dimensional image of the specimen based on the electron microscopic image;
processing for generating a two-dimensional element map representing two-dimensional element distribution of the specimen based on the output signal from the second detector; and
processing for generating the three-dimensional element map by projecting the two-dimensional element map on the three-dimensional image.

2. The electron microscope of claim 1, wherein,
in the processing for generating the two-dimensional element map, a plurality of the two-dimensional element maps are generated, and
in the processing for generating the three-dimensional element map, the plurality of two-dimensional element maps are projected on the three-dimensional image.

3. The electron microscope of claim 2, wherein,
in the processing for generating the two-dimensional element map, the hue of a pixel which forms the two-dimensional element map is set to correspond to the kind of the element, and the brightness of the pixel which forms the two-dimensional element map is set to correspond to the signal intensity of the element.

4. The electron microscope of claim 1, wherein,
when an arbitrary section is specified in the three-dimensional element map, the processor performs processing for generating a graph including a signal intensity profile of the element in the section and a height profile of the specimen in the section.

5. The electron microscope of claim 1, wherein
the signal is a characteristic X-ray.

6. An image processing method in an electron microscope that includes: a first detector which detects electrons emitted from a specimen or transmitted through the specimen upon irradiation of the specimen with an electron beam; and a second detector which detects a signal emitted from the specimen upon irradiation of the specimen with the electron beam, the image processing method comprising:

generating an electron microscopic image based on an output signal from the first detector;

generating a three-dimensional image of the specimen based on the electron microscopic image;

generating a two-dimensional element map representing two-dimensional element distribution of the specimen based on an output signal from the second detector; and generating a three-dimensional element map representing three-dimensional element distribution of the specimen by projecting the two-dimensional element map on the three-dimensional image.

\* \* \* \* \*